United States Patent [19]
Schierz et al.
[11] 3,708,730
[45] Jan. 2, 1973

[54] CONTACT STRUCTURE FOR MULTIPLE WAFER SEMICONDUCTOR RECTIFIER ARRANGEMENT

[75] Inventors: Winfried Schierz, Roth; Liboslav Vladik, Nurnberg, both of Germany

[73] Assignee: Semikron Gesellschaft fur Gleichrichterbau und Elektronik m.b.H., Nurnberg, Germany

[22] Filed: Feb. 5, 1970

[21] Appl. No.: 8,997

[30] Foreign Application Priority Data

Feb. 13, 1969 Germany ....................P 19 07 075.8

[52] U.S. Cl. ..........317/234 R, 317/234 N, 317/234 P
[51] Int. Cl. ..................................................H01l 5/02
[58] Field of Search ............................317/234, 5.4, 6

[56] References Cited

UNITED STATES PATENTS

| | | | |
|---|---|---|---|
| 3,500,136 | 3/1970 | Fisher | 317/234 |
| 3,281,628 | 10/1966 | Bauer et al. | 317/234 |
| 3,537,175 | 11/1970 | St. Clair et al | 317/234 |
| 3,602,983 | 9/1971 | Bertioli et al | 29/577 |

*Primary Examiner*—John W. Huckert
*Assistant Examiner*—E. Wajciechowicz
*Attorney*—Spencer & Kaye

[57] ABSTRACT

A semiconductor rectifier device, for use particularly with miniature devices, wherein two or more semiconductor diode wafers are initially connected to the conductor portions of the planar circuit by means of clamp-type mountings and are then simultaneously permanently connected to the conductors. The devices are then embedded in an insulating material with the conductor portions extending out of the housing formed by the insulating material in a predetermined direction and orientation. The portions of the circuit constituting the clamp-type mountings and the conductor portions are formed by dividing a strip of conductive sheet material into a plurality of sections having a certain areal expanse which form a geometric structure. Each of the structures includes, in interlocked fashion, the portions of the circuit comprising the clamp-type mountings and the current conductors. The current conductor portions of the circuit extend from the center of the structure parallel to one another and/or at a desired angle with respect to one another toward the edge of the structure and function as supporting bars between the central portion of the structure and the strip of conductive sheet material.

10 Claims, 5 Drawing Figures

INVENTORS.
Winfried Schierz
Liboslav Vladik
BY Spencer & Kaye
ATTORNEYS.

INVENTORS.
Winfried Schierz
Liboslav Vladik

BY Spencer & Kaye
ATTORNEYS.

CONTACT STRUCTURE FOR MULTIPLE WAFER SEMICONDUCTOR RECTIFIER ARRANGEMENT

BACKGROUND OF THE INVENTION

The present invention relates to a semiconductor rectifier arrangement, and in particular, to a semiconductor miniature rectifier arrangement wherein two or more semiconductor wafers are initially electrically connected by means of contact pieces forming a clamp-type mounting and then permanently electrically connected to the current conductor portions to form the desired circuit, and are embedded in an insulating mass; the current conductor sections outside of the housing being arranged in a predetermined direction.

Various techniques for the manufacture of semiconductor rectifier circuits have been known in the prior art. Many of these techniques, however, suffer from a number of drawbacks which make them rather expensive and/or not readily useable with mass production techniques. For example, in the German Published Pat. application DAS No. 1,246,888 there is shown a semiconductor rectifier circuit for low values of current wherein the semiconductor wafers are placed at the points of intersection of overlappingly arranged conductor portions, and wherein the conductor portions extend in one plane and protrude from one side of the device. The construction of such rectifier circuits, however, requires special fabricating devices for connecting a plurality of individual components together, and for maintaining the same in the desired circuit arrangement. This is particularly true with respect to accurately associating and contacting the individual conductor portions.

It has also been proposed to fasten a semiconductor wafer between the ends of a hairpin-shaped wire and to arrange a plurality of such arrangements, with the appropriate electrical connections and with the conductor portions being produced by cropping or separating the wire arcs, in a cup of insulating material so that the remaining portions of the conductive leads which are outside of the housing leave the cover surface of the cup parallel to one another. Such embodiments are expensive to manufacture and do not always meet the continuously increasing demand for compact sizes with optimum efficiency.

It has also been proposed to provide four strip-shaped conductors, each of which has a wire-shaped conductive lead in the center of its surface extending perpendicular thereto, with their ends overlapping at right angles. A semiconductor wafer with the appropriate electrical orientation is inserted between the conductors and connected thereto at each point of overlap to form a rectifier bridge circuit, and the entire unit is then inserted in a suitable manner into a cup of insulating material. This proposal is also not always of advantage with respect to the stated requirements.

SUMMARY OF THE INVENTION

It is the object of the present invention to substantially improve the construction of semiconductor miniature rectifier arrangements with respect to the known embodiments so that the above-mentioned drawbacks are eliminated and to provide a structure which particularly and advantageously lends itself to mass production techniques.

The above object is achieved by providing an improvement which greatly simplifies the manufacture of semiconductor rectifier devices wherein a plurality of semiconductor wafers are connected to and fixed in place relative to the conductor portions of the device by means of clamp-type mountings, in that all of the conductor and clamp-type mounting portions of the device are contained in the proper operative relationship in a single unit or preform. According to the invention, a band of conductive sheet material is provided which has a plurality of openings therein so that the sheet is divided into a plurality of sectional areas which form a planar geometric structure. The various sections constitute all of the supporting and upper contacts for the clamp-type mountings for the semiconductor wafers and the conductor portions of the circuit of the device, and are arranged so that the surface areas of the contact and conductor portions are interlocked in the central portion of the structure. The current conductor portions which are to form the external connections for the device extend from the central portion of the structure toward the edges thereof at desired angles with respect to one another, for example, at a right angle, and/or parallel to one another, and are connected to the surrounding portions of the strip of conductive sheet material to support the central portion of the structure within the strip during the manufacturing process.

DESCRIPTION OF THE PREFERRED EMBODIMENTS

Figure 1:
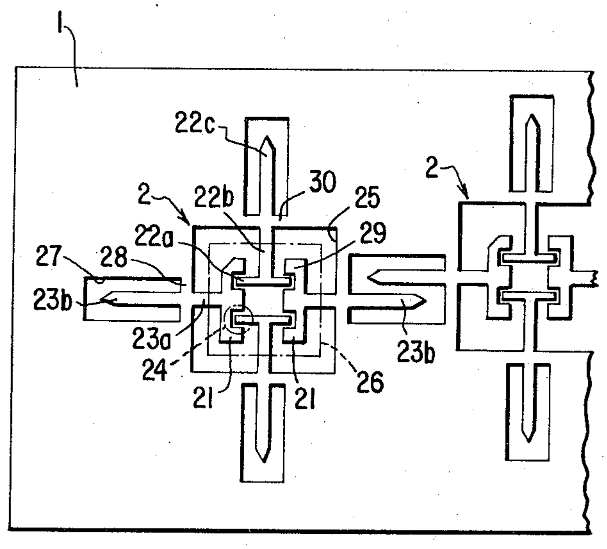
FIG. 1 is a plan view of one embodiment of a geometrical structure of sheet type conductive material according to the invention.

Referring now to the figures wherein the same reference numerals are used in all of the figures to refer to the same structural element, there is shown in FIG. 1 a strip or band shaped foil or sheet 1 of conductive material which is preferably copper, but may be of another material such as brass or an iron-nickel-cobalt alloy. The strip of conductive sheet material 1 is provided with a number of openings formed, for example, by cutting or etching, which divide the surface of the strip 1 into a plurality of sectional areas so as to result in formation of a plurality of planar geometric structures 2. Each planar geometrical structure 2 contains all of the conductive portions necessary for a semiconductor single-phase bridge rectifier circuit as well as the clamp-type mounting contact pieces required to hold and contact the semiconductor wafers. As shown, two support or lower contact elements 21 are provided in a rectangular opening 25 which are arranged to be mirror images of one another. The lower contact elements 21 are connected with the remainder of the strip of conductive material 1 through bars 23*a* which also form the conductor portions of the completed device which will remain within the housing, indicated by the dashed line 26, formed when the semiconductor is encapsulated. Each conductor portion 23*a* extends into a conductor portion 23*b*, formed within an, opening 27 via an intermediate bar 28 of the sheet 1 which serves to stabilize the structure during the fabrication process. The conductor portion 23*b* forms the conductive connection of the semiconductor device outside of the housing 26. Each of the two supporting elements 21 is provided at its inner edge with two groove-type notches or recesses 29 which are preferably symmetrical about a centerline extending perpendicular to the edge of the strip 1.

The upper contacts for the clamp-type mountings are formed by the transverse bars 22*a* each of which, as shown, extends into, in interlocking fashion, oppositely positioned recesses 29 of the supporting contact elements 21. The upper contacts 22*a* are connected to the remainder of the strip of conductive sheet material 1 by means of conductor portions 22*b* which extend outwardly from the central portion of the geometrical structure 2 toward the edge thereof, and transverse intermediate bars 30. Each conductor portion 22*b*, which in the completed semiconductor device will form the portion of the conductor within the housing 25, is connected via the intermediate transverse bar 30 to a conductor portion 22*c* which will in turn form the external conductors for the finished device. By parallelly offsetting the contact portions 22*a* out of the plane of the strip 1, a clamp-type mounting will be formed between the contacts 22*a* and the associated underlying portion of the support elements 21, into which a semiconductor wafer 24 may be inserted and held by spring pressure. By placing four such semiconductor wafers 24 with the proper electrical orientation within the four clamp-type mountings formed between the contact portions 21 and 22*a*, the desired bridge rectifier circuit may be fabricated.

The areal expanse of the support element 21 and contact pieces 22*a* is determined by the contact surface of the semiconductor wafers, by the requirement for sufficient surface contact between the wafers 24 and contacts 21 and 22*a* and by the thermal operating behavior of the device. The dimensions of conductor portions 22*c* and 23*b* in turn depend on the installation requirements. The thickness of the strip or foil 1 is determined by the current carrying capacity and the fabrication process for the geometric structure 2. When the structure was produced by etching, particularly favorable results were achieved with sheet material of 0.2 to 0.5 mm in thickness. For the more economical production of a larger number of structures from one strip of conductive sheet material 1, as shown, the geometrical structures 2 are arranged somewhat offset with respect to the longitudinal axis of the slab and engage into one another at their facing conductor portions, e.g., conductor portions 23*b* in opening 27.

Figure 2:
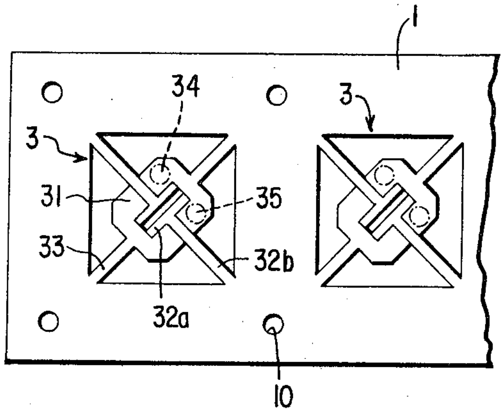
FIG. 2 is a plan view of a second embodiment of a geometrical structure of sheet type conductive material according to the invention.

FIG. 2 shows a modification of the embodiment of FIG. 1. By arranging the conductor portions 32*b* and 33 in the diagonals of a rectangle a particularly favorable arrangement with respect to areal expanse of a number of geometrical structures 3 on the strip of sheet material 1 is realized. The supporting elements 31 and the contact pieces 32*a*, approximately correspond in their construction and arrangement with respect to one another to the elements 21 and 22*a* respectively of FIG. 1. In contrast thereto, contact pieces 32*a* are removed in parallel out of the plane of sheet 1 by bending section 32*b* at a right angle approximately at the associated edge 35 of supporting element 31 and are so arranged above the supporting elements 31 that the supporting elements 31 and the contact pieces 32a form a clamp-type mounting at the surfaces 34 which are indicated by dashed lines and each intended for one semiconductor wafer, which wafer is there inserted and fixed. The perforation 10 on sheet 1 is an indexing mark which makes possible an economic fabrication process when subsequent process steps are being performed.

Figure 3:
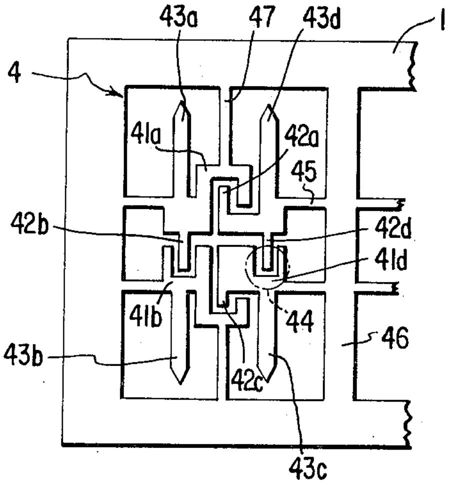
FIG. 3 is a plan view of still another embodiment of a geometrical structure of sheet type conductive material according to the invention.

FIG. 3 shows a further particularly advantageous embodiment of the present invention wherein a geometrical structure 4, which is preferably also for producing a semiconductor single-phase bridge rectifier circuit, is formed in a strip of conductive sheet material 1. The geometrical structure 4 is provided with lower contact pieces 41*a* to 41*d* for supporting a semiconductor wafer 44 each, and upper contact pieces 42*a* to 42*d* to further contact each semiconductor wafer 44. One lower and one upper contact piece, for example 41*b*,42*b*, are so constructed as a pair and are arranged to engage or interlock with their surfaces that suitable bending of each upper contact piece 42*a*–42*d* out of the plane of the strip 1 assures, with the appropriate mutual association of the underlying lower contact 41*a*–41*d*, the insertion and clamp-type mounting of a semiconductor wafer 44. The conductors 43*a*–43*d* for the device are connected to the various contact portions and extend toward the edge of the geometric structure. In order to support the upper and lower contact portions 42 *a*–42*d* and 41*a*–41 respectively, the conductors 43*a*–43*d* are connected to the sheet 1 by means of auxiliary bars 45. Additional auxiliary bars 47 are also provided to give additional stability to the structure 4 during the manufacturing process. Alternatively, the bars 47 can be eliminated and the conductor portions 43*a*–43*d* extended to and connected with the edges of the structure, i.e., the remainder of the sheet 1, in the same manner as that shown in FIG. 1. Contrary to the embodiments of FIGS. 1 and 2, the embodiment of FIG. 3 has the advantage that all semiconductor wafers may be inserted in the same electrical orientation. For this purpose, for example, one section of the structure 4 forms a lower contact piece 41*a* for placing a first semiconductor wafer thereon and simultaneously, a bar-type extension of this section forms the upper contact piece 42*b* for contacting the upper surface of a second semiconductor wafer, and a further bar-type extension of said section forms the conductive connection 43*a* to one of the two a.c. connections of the rectifier circuit. The other a.c. connection, is provided by another section of the structure 4 which is constructed in the same manner (41*d*, 42*c* 43*c*). The electrical association of the remaining d.c. connections with the semiconductor wafer determines its suitable configuration and arrangement, as shown in the drawing. The parallel arrangement of the conductive connections 43*a*–43 results in compact construction for the device.

As regards configuration and areal expanse of the contact pieces and conductor portions, the same considerations set forth above with respect to FIG. 1 also apply here.

Figures 4, 5:
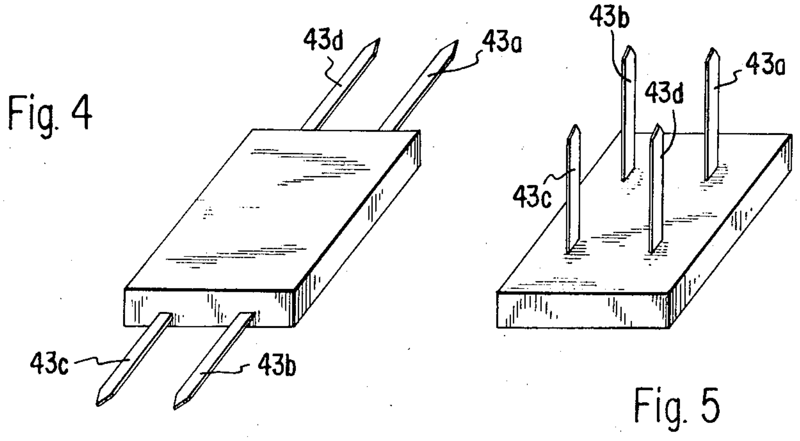
FIGS. 4 and 5 are perspective views of two embodiments of completed semiconductor devices constructed according to the invention illustrating different arrangements for the external conductors.

FIG. 4 is a perspective view of a semiconductor device according to the configuration shown in FIG. 3 embedded in a synthetic material. As can be seen the conductors extend from an edge of the housing parallel to one another. In FIG. 5 there is shown an embodiment which is also based on the structure of FIG. 3, but in which the conductive connections *43a–43d* are bent at their inner ends in a direction perpendicular to the plane of the strip 1 so that they extend from a major face of the housing. The mutual spacing of adjacent conductive connections may, if desired, be a multiple of a preferred grid dimension. Both the embodiments of FIGS. 4 and 5 may be provided on at least one side surface or edge with an extension having a suitable bore for fastening the arrangement to an adjacent structure.

The present invention is not limited to the particular rectifier circuits realized with the illustrated embodiments. By suitable construction and arrangement of the respective sections of each structure it is possible to realize in an advantageous manner semiconductor arrangements in double circuits, in center connection or in a.c. star connection or the like.

To produce the semiconductor device according to the present invention a strip-shaped foil 1 is used whose length is limited only by the dimensions of the devices required to be prepared. A particular desired number of the geometrical structures 2, 3 and/or 4 according to FIGS. 1 to 3 are then formed by means of known processes, preferably by cutting or directed etching, within the strip 1. If necessary these structures are provided, at least on the side on which the semiconductor wafers are to be disposed, with a metallic coating of an easily solderable material to improve contacting of the semiconductor wafers. Such a coating may, for example, consist of tin or stanniferous alloys. The structural unit prepared in this manner is provided with semiconductor wafers in the electrical orientation determined by the type of the structure. If embodiments according to FIG. 5 are provided, the conductive connections *43a–43* are angled off or bent before insertion and contacting of the semiconductor wafers in order to prevent mechanical stresses from being transferred to the semiconductor wafers by these process steps. Simultaneous contacting of all of the wafers may occur in an advantageous manner by immersion soldering. In the embodiment according to FIG. 1 the intermediate bars 28, 30 are subsequently removed so that unencapsulated semiconductor devices are provided with conductive connections offset in a plane by 90° each, which are thereafter embedded in a suitable manner into an insulating mass. Alternatively, the devices may be encapsulated prior to the removal of the bars 28, 30.

In the embodiment according to FIG. 2 the diagonally extending conductor portions 33 are cropped at their outer ends so that principally arrangements according to the construction of FIG. 1 result. In both embodiments the conductor portions may be, if required, angled off or bent at right angles and in the same direction with respect to the plane of the sheet 1 at a suitable point. The housing 26 may be block-shaped or cylindrical.

In the embodiment according to FIG. 3 the auxiliary bars 45 are first removed so that all the devices are held within the sheet 1 only by the bars 47, or in the alternative construction, by the conductor portions 43 connected with the edge of the sheet. In this arrangement all structures are enclosed with insulating material in a suitable manner and are finally separated from the sheet 1 by cutting either the bars 47 or the ends of the conductor portions in a single process step.

It will be understood that the above description of the present invention is susceptible to various modifications, changes and adaptations, and the same are intended to be comprehended within the meaning and range of equivalents of the appended claims.

We claim

1. An article of manufacture for use in the manufacture of a semiconductor rectifier device having a plurality of interconnected semiconductor wafers each of which is electrically connected to the conductors of the device by inserting same between a pair of sectional areas of the current conductors which form the contacts of a clamp-type mounting, and wherein the device is then enclosed in an insulating material so that conductor portions extend therefrom in a desired predetermined direction, comprising:

a strip of conductive sheet material having a plurality of openings therein so that the surface thereof is divided into a plurality of sectional areas to form a geometric structure which is entirely enclosed by the conductive sheet material and with the sectional areas of said structure forming the associated supporting and upper contacts for each clamp-type mounting for the plurality of semiconductor wafers of said device and all of the respective current conductors for said contacts and for said device, the surface areas of said contacts and the portions of said conductors interconnecting said clamp-type mountings being interlocked with one another within the central portion of said structure, at least one of the contacts of each associated pair of supporting and upper contacts being bent out of the plane of said strip of conductive sheet material and a separate semiconductor wafer clamped between each associated pair of contacts, and the portions of said current conductors which are to form the external connections for said rectifying device extending from the central portion of said structure toward the edges thereof in at least two different directions and at desired angles with respect to one another and being connected to the surrounding portions of said strip of conductive sheet material to support the central portion of said structure within said strip during the manufacturing process.

2. The article of manufacture defined in claim 1 wherein at least some of said portions of said current conductors which form the external connections for said device extend from the central portion of said structure parallel to one another.

3. The article of manufacture defined in claim 1 wherein said portions of said conductors which form the external connections for said device extend from the central portion of said structure at right angles to one another.

4. The article of manufacture defined in claim 1 wherein said conductive sheet material is copper, brass or an iron-nickel-cobalt alloy.

5. The semiconductor rectifier device defined in claim 4 wherein said strip of conductive sheet material is covered an easily solderable coating.

6. The article of manufacture defined in claim 1 wherein the central portion of said structure is enclosed in a housing formed from an insulating material, said portions of said current conductors which form the external connections for said device extending outwardly from opposite edges of said housing and being arranged parallel to one another.

7. The article of manufacture defined in claim 1 wherein the central portion of said structure is enclosed in a housing formed from insulating material, said portions of said current conductors which form the external connections for said device being bent out of the plane of said strip of conductive sheet material and extending outwardly from a major face of said housing parallel to one another.

8. The article of manufacture defined in claim 1 wherein said portions of said current conductors which form the external connections for said device are connected to the said surrounding portion of the strip of conductive sheet material by means of bars of said conductive sheet material.

9. The article of manufacture in claim 8 wherein said structure is provided with additional bars of said conductive sheet material extending from the central portion of said structure to the surrounding portion of said strip of conductive sheet material for providing additional support for said structure during the manufacturing process.

10. The article of manufacture defined in claim 1 wherein said strip of conductive sheet material includes a plurality of said geometrical structures.

* * * * *